United States Patent
Salinas et al.

(10) Patent No.: US 12,243,761 B2
(45) Date of Patent: Mar. 4, 2025

(54) DETECTION AND ANALYSIS OF SUBSTRATE SUPPORT AND PRE-HEAT RING IN A PROCESS CHAMBER VIA IMAGING

(71) Applicant: Applied Materials, Inc., Santa Clara, CA (US)

(72) Inventors: Martin Jeffrey Salinas, San Jose, CA (US); Zhepeng Cong, San Jose, CA (US); Hui Chen, Tempe, AZ (US); Xinning Luan, Tempe, AZ (US); Ashur J. Atanos, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 204 days.

(21) Appl. No.: 18/050,384

(22) Filed: Oct. 27, 2022

(65) Prior Publication Data
US 2024/0145281 A1 May 2, 2024

(51) Int. Cl.
*H01L 21/67* (2006.01)
*H01L 21/687* (2006.01)

(52) U.S. Cl.
CPC .. *H01L 21/67294* (2013.01); *H01L 21/67259* (2013.01); *H01L 21/68785* (2013.01)

(58) Field of Classification Search
CPC ......... H01L 21/67294; H01L 21/67259; H01L 21/68785
See application file for complete search history.

(56) References Cited

U.S. PATENT DOCUMENTS

| | | | |
|---|---|---|---|
| 7,256,869 B2* | 8/2007 | Nishi | G03F 7/70716 430/22 |
| 9,035,474 B2* | 5/2015 | Mazure | H01L 21/76251 438/455 |
| 2007/0241202 A1 | 10/2007 | Barker et al. | |
| 2018/0315626 A1 | 11/2018 | Franklin | |
| 2021/0010138 A1 | 1/2021 | Bode et al. | |
| 2022/0121196 A1 | 4/2022 | Omori | |

(Continued)

FOREIGN PATENT DOCUMENTS

| | | |
|---|---|---|
| CN | 113990780 A | 1/2022 |
| CN | 111893567 B | 2/2022 |

(Continued)

OTHER PUBLICATIONS

PCT Notification of Transmittal of the International Search Report and the Written Opinion of the International Searching Authority for International Application No. PCT/US2023/027640; dated Nov. 7, 2023.

*Primary Examiner* — Hung V Nguyen
(74) *Attorney, Agent, or Firm* — Patterson + Sheridan, LLP

(57) ABSTRACT

An apparatus, method, and system for identifying and obtaining information related to a substrate support and/or a pre-heat ring in a process chamber via imaging and image processing. In an embodiment, a substrate support is provided. The substrate support generally includes a top surface configured to receive a substrate in a process chamber and a marking feature disposed on the top surface of the substrate support, the marking feature configured to be detectable by an imaging apparatus coupled to the process chamber to provide information related to the substrate support via imaging when the substrate support is disposed within the process chamber.

19 Claims, 7 Drawing Sheets

(56) References Cited

U.S. PATENT DOCUMENTS

| | | |
|---|---|---|
| 2022/0162751 A1 | 5/2022 | Haanstra et al. |
| 2022/0170156 A1 | 6/2022 | Jdira et al. |
| 2022/0181193 A1 | 6/2022 | Gao et al. |
| 2022/0189804 A1 | 6/2022 | Luan et al. |
| 2022/0199444 A1 | 6/2022 | Oosterlaken et al. |
| 2022/0254668 A1 | 8/2022 | Oosterlaken et al. |
| 2022/0268520 A1 | 8/2022 | Oosterlaken et al. |
| 2022/0298643 A1 | 9/2022 | Kajbafvala et al. |
| 2022/0298672 A1 | 9/2022 | M'Saad et al. |
| 2022/0301829 A1 | 9/2022 | Yoshikawa |
| 2022/0301905 A1 | 9/2022 | Ye et al. |
| 2022/0301906 A1 | 9/2022 | Naik et al. |
| 2022/0352006 A1 | 11/2022 | Huang et al. |
| 2022/0359246 A1 | 11/2022 | Umeoka |

FOREIGN PATENT DOCUMENTS

| | | |
|---|---|---|
| CN | 114000192 A | 2/2022 |
| CN | 111254487 B | 3/2022 |
| CN | 114138030 A | 3/2022 |
| CN | 114158145 A | 3/2022 |
| CN | 114351249 A | 4/2022 |
| CN | 111235551 B | 5/2022 |
| CN | 114481311 A | 5/2022 |
| CN | 114540947 A | 5/2022 |
| CN | 114540948 A | 5/2022 |
| CN | 114551331 A | 5/2022 |
| CN | 114613703 A | 6/2022 |
| CN | 114743924 A | 7/2022 |
| CN | 114823428 A | 7/2022 |
| CN | 114855272 A | 8/2022 |
| CN | 114883221 A | 8/2022 |
| CN | 114914181 A | 8/2022 |
| CN | 114927450 A | 8/2022 |
| CN | 115020281 A | 9/2022 |
| CN | 115101432 A | 9/2022 |
| CN | 115101443 A | 9/2022 |
| CN | 115101470 A | 9/2022 |
| CN | 115233303 A | 10/2022 |
| CN | 115235257 A | 10/2022 |
| CN | 115274510 A | 11/2022 |
| CN | 115312432 A | 11/2022 |
| CN | 115404543 A | 11/2022 |
| JP | 2006-228966 A | 8/2006 |
| JP | 4315427 B2 | 8/2009 |
| JP | 2014-239093 A | 12/2014 |

\* cited by examiner

DETECTION AND ANALYSIS OF SUBSTRATE SUPPORT AND PRE-HEAT RING IN A PROCESS CHAMBER VIA IMAGING

FIELD

The present disclosure relates to semiconductor manufacturing and processing. More particularly, the disclosure relates to an apparatus, method, and system for fabricating devices on a semiconductor substrate. Specifically, embodiments of the present disclosure provide an apparatus, method, and system for identifying and analyzing a substrate support and/or a pre-heat ring in a process chamber via imaging.

BACKGROUND

Trends toward smaller critical dimensions in semiconductor processing have caused an exponential increase in the precision with which fabrication processes must be performed by the semiconductor device manufacturer. Semiconductor based integrated circuits are typically manufactured through the formation of a set of layers on a substrate containing many integrated circuit areas which will later be separated into individual dies. Very thin layers of material are deposited one on top of the other in patterns to form integrated circuit components.

In a semiconductor device fabrication process, such as CVD, epitaxy, or other thermal processing, substrates are often processed within chambers or other processing apparatuses. In order to process a substrate within the chamber, the substrate may be firmly attached to a substrate support (e.g. susceptor) within the chamber during processing to mitigate movement of the substrate. A variety of substrate supports with different designs and corresponding pre-heat rings for use therewith have been developed and are used to accommodate for a variety of substrates and process chambers. For example, substrate supports are designed with varying pocket sizes and surface features that may each require specific set up and substrate handling protocols to properly use the substrate support. For example, a substrate support designed with a tighter pocket provides less clearance for substrate placement and would require more precise substrate handling protocols when loading the substrate on the substrate support. Improper set up and/or handling procedures in relation to the specific substrate support used and/or the corresponding pre-heat ring may cause the substrate support to be improperly installed and/or misaligned when in use which can adversely affect the fabrication process or the quality/performance of the component being produced.

With conventional substrate supports and pre-heat rings in process chambers, visualization systems implemented in process chambers for viewing processing of substrates are currently unable to identify the substrate support or the pre-heat ring installed in a process chamber through imaging the substrate support and pre-heat ring. For example, to identify conventional substrate supports installed in a process chamber, the substrate support is removed from the process chamber by users to manually view the identification information on the back side of the substrate support.

Depending on the design and use of the substrate support and the pre-heat ring, the substrate support and pre-heat ring will both have a limited service life in which the parts can be effectively and reliable used in process chambers. For example, degradation will eventually affect the performance of the substrate support, such as the substrate no longer being firmly adhered to the substrate support. In processing, this may cause the substrate to move—which may cause substrate misalignment. If the substrate becomes misaligned, uniformity in thickness and/or film properties may be adversely impacted.

Therefore, a need exists for an improved apparatuses, methods and systems for identifying and imaging substrate supports and pre-heat rings used in a process chamber.

SUMMARY

The present disclosure provides an apparatus, method, and system for identifying and analyzing a substrate support in a process chamber via imaging. In some embodiments, a substrate support is provided. The substrate support includes a top surface configured to receive a substrate in a process chamber and a marking feature disposed on the top surface of the substrate support. The marking feature is configured to be detectable by an imaging apparatus coupled to the process chamber to provide information related to the substrate support via imaging when the substrate support is disposed within the process chamber.

In another embodiment, a substrate support is provided. The substrate support includes a top surface configured to receive a substrate in a process chamber and a marking feature disposed on the top surface of the substrate support. The marking feature includes a height extending from the top surface of the substrate support and an outer surface containing silicon carbide (SiC). The marking feature is configured to be detectable by an imaging apparatus coupled to the process chamber when the substrate support is disposed within the process chamber.

In yet another embodiment, a processing system configured to analyze a substrate support disposed in a process chamber is provided. The processing system includes a process chamber having a process volume and an imaging apparatus coupled to the process chamber. The imaging apparatus includes a view field and is coupled to a controller having a processor and a memory. The memory includes a software program configured to perform an operation for imaging and obtaining information related to a substrate support disposed in the processing volume of the process chamber when the substrate support is in the view field of the imaging apparatus. The substrate support includes a top surface configured to receive a substrate in the process chamber and a marking feature disposed on the top surface of the substrate support. The marking feature is configured to be detectable by the imaging apparatus to provide information related to the substrate support via imaging when the substrate support is disposed within the process chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
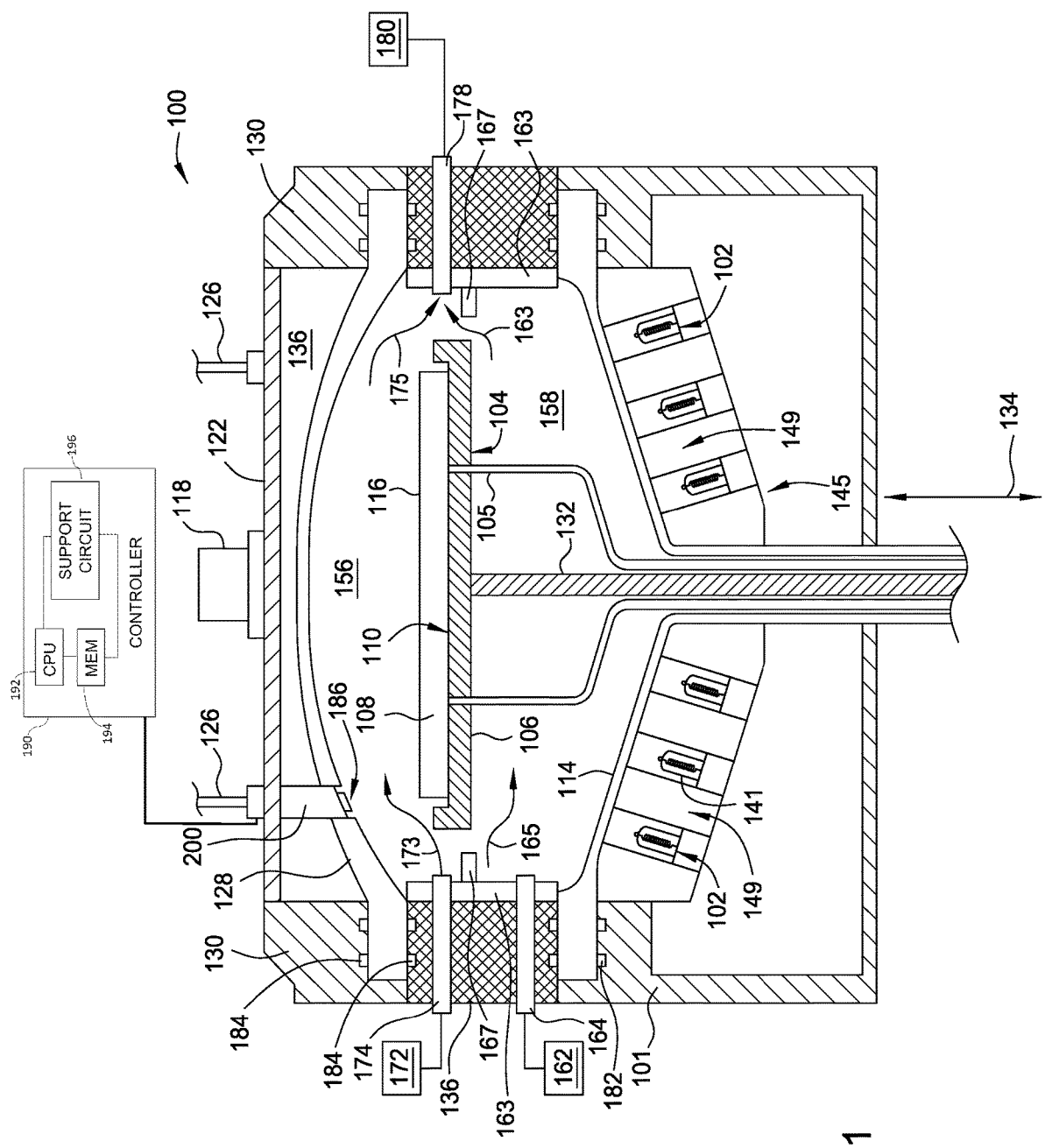
FIG. 1 is a schematic diagram showing a cross-sectional view of a process chamber including a substrate support assembly and a visualization apparatus, according to certain embodiment of the present disclosure.

Embodiments described herein generally relate to an apparatus and method for identifying a substrate support and/or a pre-heat ring in a process chamber and obtaining information related to the substrate support, the pre-heat ring (if present) and their use in the process chamber thereof. In one example, methods and apparatus for identifying the substrate support generally include disposing a marking feature on a top surface of the substrate support and imaging the marking feature when the substrate support is disposed inside the process chamber to identify and determine the specific model (or design) of the substrate support in the process chamber. The same is also applicable to identify the pre-heat ring in the processing chamber by disposing the marking feature on a top surface of the pre-heat ring. Each marking feature to be disposed on a substrate support or a pre-heat ring corresponds with a specific model (or design) of an available substrate support or pre-heat ring, respectively. When the specific marking feature on the substrate support and pre-heat ring is imaged, the marking feature is analyzed and may then be used to identify the model of the respective substrate support or pre-heat ring the imaged marking feature is disposed on.

In another example, methods and apparatus for monitoring and analyzing a substrate support and/or a pre-heat ring used in a process chamber generally include disposing a marking feature on a top surface of the substrate support and/or the pre-heat ring, imaging the marking feature when the substrate support and/or the pre-heat ring is inside the process chamber, and analyzing the marking feature to obtain information related to the substrate support and/or the pre-heat ring the imaged marking feature is disposed on. Examples of information that may be obtained from the imaging of the marking feature on the substrate support or the pre-heat ring include information related to a reference measurement for direct scaling at the substrate support and pre-heat ring level of imaging obtained of the substrate support or the pre-heat ring in the process chamber, a reference point for detection and determination of rotation angles by the substrate support or the pre-heat ring in the process chamber, a reference point for detection and tracing of the installation position of the substrate support or the pre-heat ring in the process chamber, and/or an indication of when the substrate support or the pre-heat ring is likely to be near the end of its service life.

Typically, processing systems have a centralized transfer chamber mounted on a monolith platform. The transfer chamber is the center of activity for the movement of substrates being processed in the system. One or more process chambers are mounted to the transfer chamber at slit valves through which substrates are passed by a substrate handler, or robot. Access to the transfer chamber from the clean ambient environment is typically through one or more load lock chambers attached at other slit valves. The load lock chambers may open to a very clean room, referred to as the white area, or to an optional substrate handling chamber, typically referred to as a mini-environment.

FIG. 1 shows a schematic sectional view of a process chamber 100 having a substrate support assembly and a visualization apparatus, in accordance with certain aspects of the present disclosure. The process chamber 100 may be configured to perform epitaxial deposition processes. The process chamber 100 may be used to process one or more substrates, including the deposition of a material on an upper surface of a substrate 108. The process chamber 100 may include an array of radiant heating lamps 102 for heating, among other components, a back side 104 of a substrate support 106 (e.g., which may be a susceptor) disposed within the process chamber 100. In some embodiments, the array of radiant heating lamps may be disposed over the upper dome 128. The substrate support 106 may be a disk-like substrate support 106 as shown, or may be a ring-like substrate support 107 with no central opening, which supports the substrate from the edge of the substrate to facilitate exposure of the substrate to the thermal radiation of the lamps 102.

The substrate support 106 is located within the process chamber 100 between an upper dome 128 and a lower dome 114. The upper dome 128, the lower dome 114 and a base ring 136 that is disposed between the upper dome 128 and lower dome 114 generally define an internal region of the process chamber 100. The substrate 108 (not to scale) can be brought into the process chamber 100 and positioned onto the substrate support 106 through a loading port 103.

The substrate support 106 is shown in an elevated processing position, but may be vertically traversed by an actuator (not shown) to a loading position below the processing position to allow lift pins 105 to contact the lower dome 114, passing through holes in the substrate support 106 and the central shaft 132, and raise the substrate 108 from the substrate support 106. A robot (not shown) may then enter the process chamber 100 to engage and remove the substrate 108 therefrom though the loading port 103. The substrate support 106 then may be actuated up to the processing position to place the substrate 108, with its device side 116 facing up, on a top surface 110 of the substrate support 106.

The substrate support 106, while located in the processing position, divides the internal volume of the process chamber 100 into a process gas region 156 that is above the substrate, and a purge gas region 158 below the substrate support 106. The substrate support 106 is rotated during processing by a central shaft 132 to minimize the effect of thermal and process gas flow spatial anomalies within the process chamber 100 and thus facilitate uniform processing of the substrate 108. The substrate support 106 is supported by the central shaft 132, which moves the substrate 108 in an up and down direction 134 during loading and unloading, and in some instances, processing of the substrate 108. The substrate support 106 may be formed from silicon carbide or graphite coated with silicon carbide to absorb radiant energy from the lamps 102 and conduct the radiant energy to the substrate 108.

In general, the central window portion of the upper dome 128 and the bottom of the lower dome 114 are formed from an optically transparent material such as quartz. "Optically transparent" here means generally transmissive to radiation, but not necessarily 100% transmissive. As will be discussed in more detail below with respect to FIG. 1, the thickness and the degree of curvature of the upper dome 128 may be configured in accordance with the present invention to provide a flatter geometry for uniform flow uniformity in the process chamber.

One or more lamps, such as an array of lamps 102, can be disposed adjacent to and beneath the lower dome 114 in a specified manner around the central shaft 132 to independently control the temperature at various regions of the substrate 108 as the process gas passes over, thereby facilitating the deposition of a material onto the upper surface of the substrate 108. While not discussed here in detail, the deposited material may include gallium arsenide, gallium nitride, or aluminum gallium nitride, among other materials.

The lamps 102 may be configured to include bulbs 141 and be configured to heat the substrate 108 to a temperature within a range of about 200 degrees Celsius to about 1600 degrees Celsius. Each lamp 102 is coupled to a power distribution board (not shown) through which power is supplied to each lamp 102. The lamps 102 are positioned within a lamphead 145 which may be cooled during or after processing by, for example, a cooling fluid introduced into channels 149 located between the lamps 102. The lamphead 145 conductively and radiatively cools the lower dome 114 due in part to the close proximity of the lamphead 145 to the lower dome 114. The lamphead 145 may also cool the lamp walls and walls of the reflectors (not shown) around the lamps. Alternatively, the lower dome 114 may be cooled by a convective approach. Depending upon the application, the lampheads 145 may or may not be in contact with the lower dome 114.

A circular shield 167 may be optionally disposed around the substrate support 106 and surrounded by a liner assembly 163. The shield 167 prevents or minimizes leakage of heat/light noise from the lamps 102 to the device side 116 of the substrate 108 while providing a pre-heat zone for the process gases. The shield 167 may be made from CVD SiC, sintered graphite coated with SiC, grown SiC, opaque quartz, coated quartz, or any similar, suitable material that is resistant to chemical breakdown by process and purging gases.

The liner assembly 163 is sized to be nested within or surrounded by an inner circumference of the base ring 136. The liner assembly 163 shields the processing volume (i.e., the process gas region 156 and purge gas region 158) from metallic walls of the process chamber 100. The metallic walls may react with precursors and cause contamination in the processing volume. While the liner assembly 163 is shown as a single body, the liner assembly 163 may include one or more liners with different configurations.

As a result of backside heating of the substrate 108 from the substrate support 106, the use of an optical pyrometer 118 for temperature measurements/control on the substrate support can be performed. This temperature measurement by the optical pyrometer 118 may also be done on substrate device side 116 having an unknown emissivity since heating the substrate top surface 110 in this manner is emissivity independent. As a result, the optical pyrometer 118 can only sense radiation from the hot substrate 108 that conducts from the substrate support 106, with minimal background radiation from the lamps 102 directly reaching the optical pyrometer 118.

A reflector 122 may be optionally placed outside the upper dome 128 to reflect infrared light that is radiating off the substrate 108 back onto the substrate 108. The reflector 122 may be secured to the upper dome 128 using a clamp ring 130. The reflector 122 can be made of a metal such as aluminum or stainless steel. The efficiency of the reflection can be improved by coating a reflector area with a highly reflective coating such as with gold. The reflector 122 can have one or more conduits 126 connected to a cooling source (not shown). The conduit 126 connects to a passage (not shown) formed on a side of the reflector 122. The passage is configured to carry a flow of a fluid such as water and may run horizontally along the side of the reflector 122 in any desired pattern covering a portion or entire surface of the reflector 122 for cooling the reflector 122.

Process gas supplied from a process gas supply source 172 is introduced into the process gas region 156 through a process gas inlet 174 formed in the sidewall of the base ring 136. The process gas inlet 174 is configured to direct the process gas in a generally radially inward direction. During the film formation process, the substrate support 106 may be located in the processing position, which is adjacent to and at about the same elevation as the process gas inlet 174, allowing the process gas to flow up and round along flow path 173 across the upper surface of the substrate 108 in a laminar flow fashion. The process gas exits the process gas region 156 (along flow path 175) through a gas outlet 178 located on the side of the process chamber 100 opposite the process gas inlet 174. Removal of the process gas through the gas outlet 178 may be facilitated by a vacuum pump 180 coupled thereto. As the process gas inlet 174 and the gas outlet 178 are aligned to each other and disposed approximately at the same elevation, it is believed that such a parallel arrangement, when combing with a flatter upper dome 128 (as will be discussed in detail below), will enable a generally planar, uniform gas flow across the substrate 108. Further radial uniformity may be provided by the rotation of the substrate 108 through the substrate support 106.

Figure 2A:
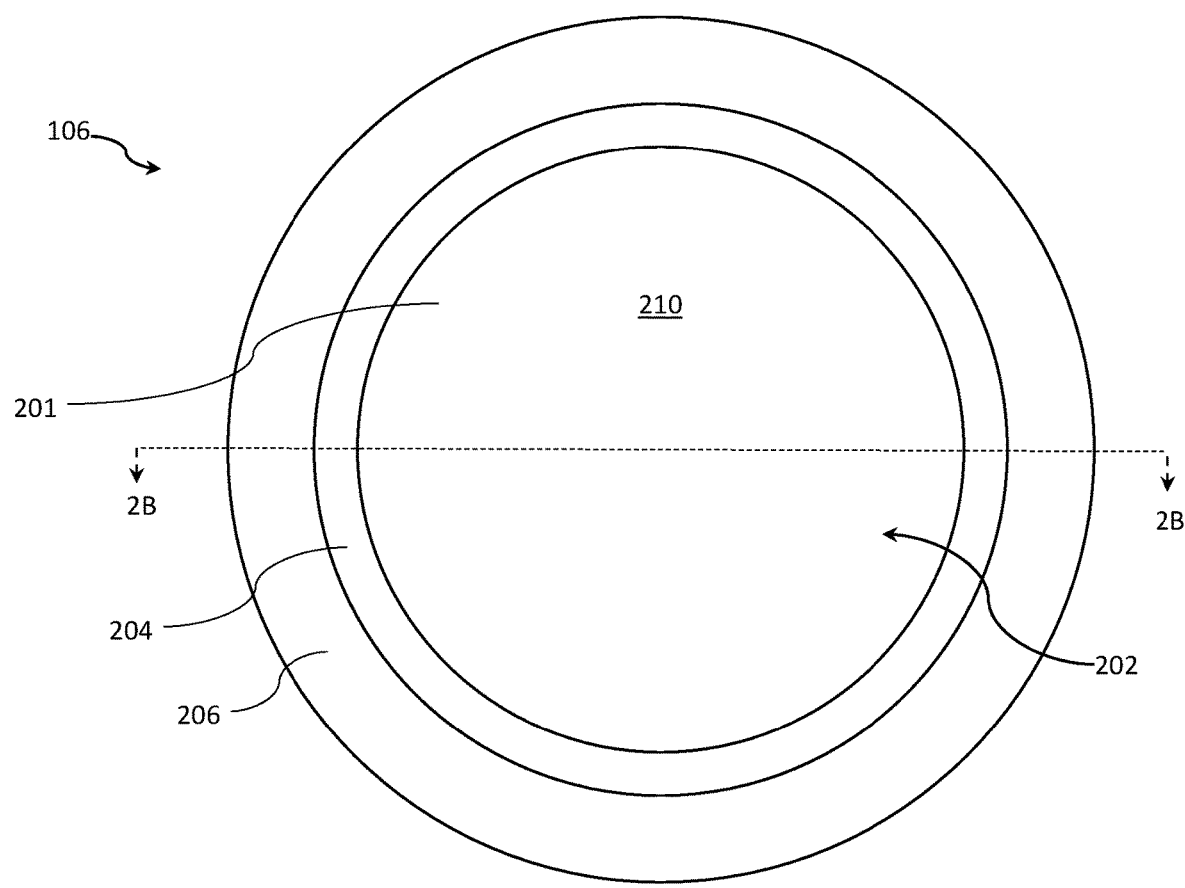
FIG. 2A shows a top view of an example substrate support in the process chamber of FIG. 1, according to certain embodiment of the present disclosure.
Figure 2B:
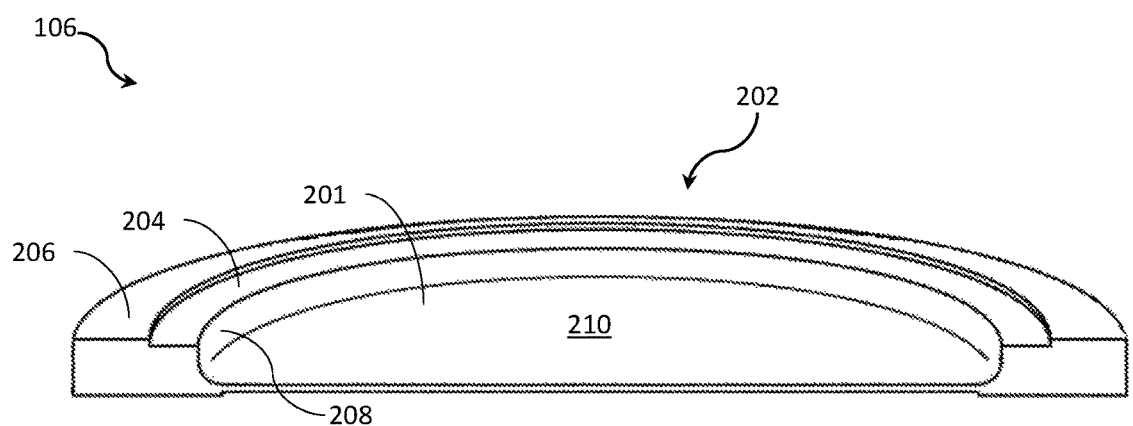
FIG. 2B shows a cutaway perspective view of the substrate support shown in FIG. 2A, according to certain embodiment of the present disclosure.

FIGS. 2A and 2B shows an example of the substrate support 106 that may be used in the process chamber of FIG. 1, according to certain embodiment of the present disclosure. The substrate support 106 includes a pocket 201 formed on a top surface 202 of the substrate support 106. The pocket 201 is defined by an annular-shaped edge 204 which is further bound by a rim 206. The pocket 201 includes a side wall 208 and a substrate receiving surface 210 for holding the substrate 108. For a given substrate 108, the substrate receiving surface 210 of the pocket 201 generally has a diameter only slightly larger than that of the substrate 108. When in use, the substrate 108 is centered in the pocket 201 on the substrate receiving surface 210 and a gap is maintained between the edge of the substrate 108 and the side wall 208 of the pocket 201.

As discussed above, methods and apparatus are provided herein for using a marking feature disposed on the substrate support to identify a model of the imaged substrate support (e.g., susceptor) disposed in a process chamber and/or obtaining information related to the substrate support and its use in the process chamber thereof. As such, a visualization system including an imaging apparatus (e.g., such as a camera 200 shown in FIG. 1), either inside a process chamber (e.g., such as process chamber 100) or outside the chamber but with a view through an aperture in the chamber, can be used to image the marking feature disposed on the substrate support when the substrate support is disposed within the chamber.

As shown in FIG. 1, the process chamber 100 may include the camera 200 to view the substrate 108, the substrate support 106, and/or a pre-heat ring coupled to the substrate support 106 (not shown) in process chamber 100 during processing. The camera 200 may be positioned above the top of the process chamber 100, and a collection device, for example a light pipe, for the camera may be disposed through the top of the process chamber 100 into the process gas region 156. Alternately, the camera 200 may be positioned inside the process chamber 100. For example, the camera 200 may be disposed in an opening 186 in the upper dome 128 between the upper dome 128 and the reflector 122. The camera 200, or a collection device for the camera, may be disposed through a portal for connecting the conduit 126 to the process chamber 100, or alternatively, the camera 200 may be coupled to the chamber using a chassis. The camera 200 may be capable of operating in a vacuum or at atmospheric pressure. The camera 200 may be in the process chamber 100 to take an image of the substrate 108, an edge ring, a mask, and/or the substrate support 106. The position of the camera 200 relative to the upper dome 128 and the substrate support 106, and the optical characteristics of the camera 200 may be determined to ensure a field of view that includes the regions of interest on the substrate support 106.

The camera 200 can be electrically coupled to a controller 190 that controls operations (e.g., on/off, focusing, image-taking, and the like) of the camera 200. The controller 190 also includes a central processing unit (CPU) 192, a memory 194, and a support circuit 196. The CPU 192 may be one of any form of a general purpose computer processor that can be used in an industrial setting. The support circuit 196 is conventionally coupled to the CPU 192 and may comprise cache, clock circuits, input/output subsystems, power supplies, and the like. The software routines, when executed by the CPU 192, transform the CPU 192 into a specific purpose computer (controller) 191. The software routines may also be stored and/or executed by a second controller (not shown) that is located remotely from the process chamber 100.

Memory 194 may store information for processing and retrieval during operation of CPU 192. Memory 194 may store program instructions and/or data associated with the various marking features used and corresponding substrate support models, as described in accordance with one or more aspects of this disclosure. CPU 192 may execute instructions and one or more storage devices for memory 194 may store instructions and/or data of one or more software routines. The combination of CPU 192 and memory 194 may retrieve, store, and/or execute the instructions and/or data of one or more applications or software to be executed by the controller 190. The controller 190 may download a program stored in the memory 194 through an input/output (I/O) device (not shown) and carry out imaging of the substrate support 106 and/or the coupled pre-heat ring by controlling the camera 200 in accordance with the program.

It should be noted that the camera 200 is only one example of an apparatus that can be used for imaging and that any other types of imaging apparatus can be used as a positioning detection apparatus. In embodiments, more than one camera can be used to capture images of the substrate support 106. In embodiments, the camera 200 is an image capturing device which may include a high efficiency, low voltage complementary metal oxide semiconductor (CMOS) sensor, and as such, may function as a single chip video camera. The CMOS sensor may be of the VGA type. The camera 200 may include a lens, such as a wide angle lens or a plano-convex type lens having an appropriate focal length to provide sufficient visual clarity within the desired range of operation of the camera 200. It will be apparent to those skilled in the art that different lenses (e.g., telescoping or rotational prism lenses) may be used for different applications. It will also be appreciated that other types of cameras or optical sensors may be employed, including, but not limited to cameras of the SVGA, XGA, MEGA pixel type, or other image capturing devices. If desired, multiple image capturing devices of differing types of resolution can be employed in conjunction with lenses of varying types and focal lengths. The camera or sensor could be of a static (still) or dynamic (video) type and could be of the charged coupled device (CCD) type. In addition, the camera could be used to output a video signal to any standard TV format.

Figure 3A:
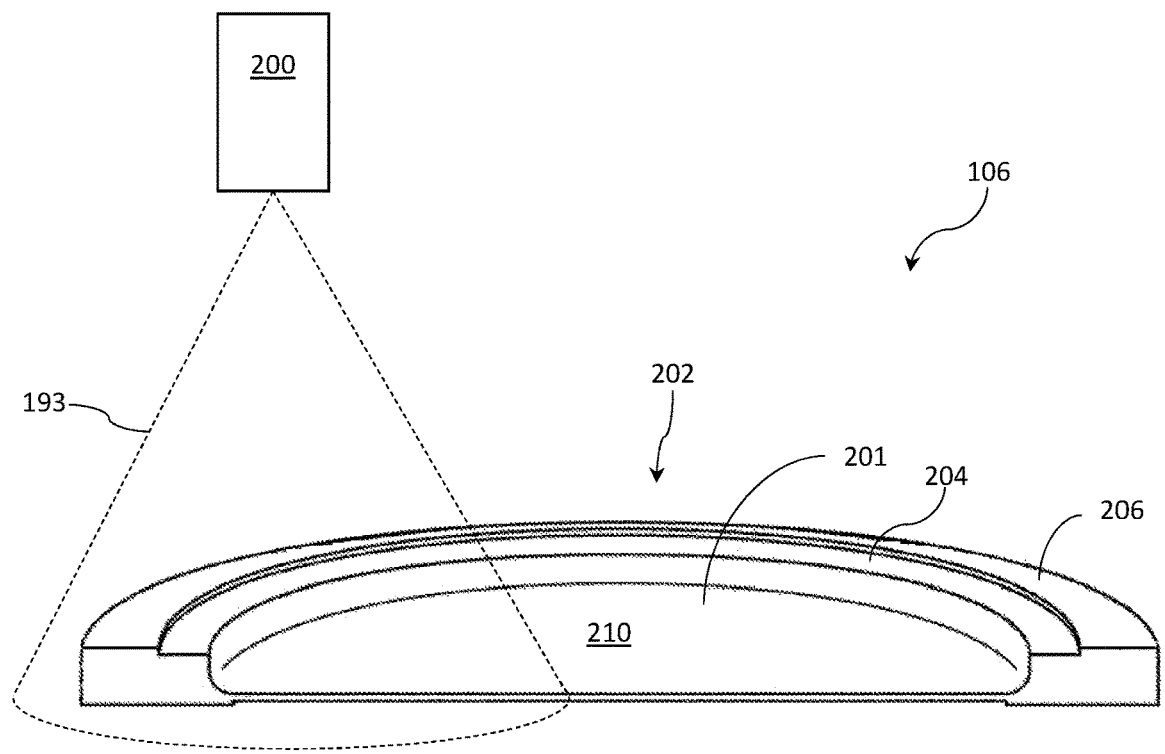
FIG. 3A shows the view field of a camera over the substrate support in the process chamber of FIG. 1, according to certain embodiments of the present disclosure.

In an embodiment, when imaging the substrate support 106, the camera 200 may be used to image portions of the substrate support 106 within a view field 193 of the camera 200 (as shown in FIG. 3A). For in situ imaging and analysis of the substrate support 106 in the process chamber 100, the regions of interest of the substrate support 106 in which the marking feature may be disposed on include portions of the substrate support 106 where the top surface 202 of the substrate support 106 remain unoccupied when the substrate support 106 is loaded with the substrate 108, as well as being within the field of view of the camera 200.

Figure 3B:
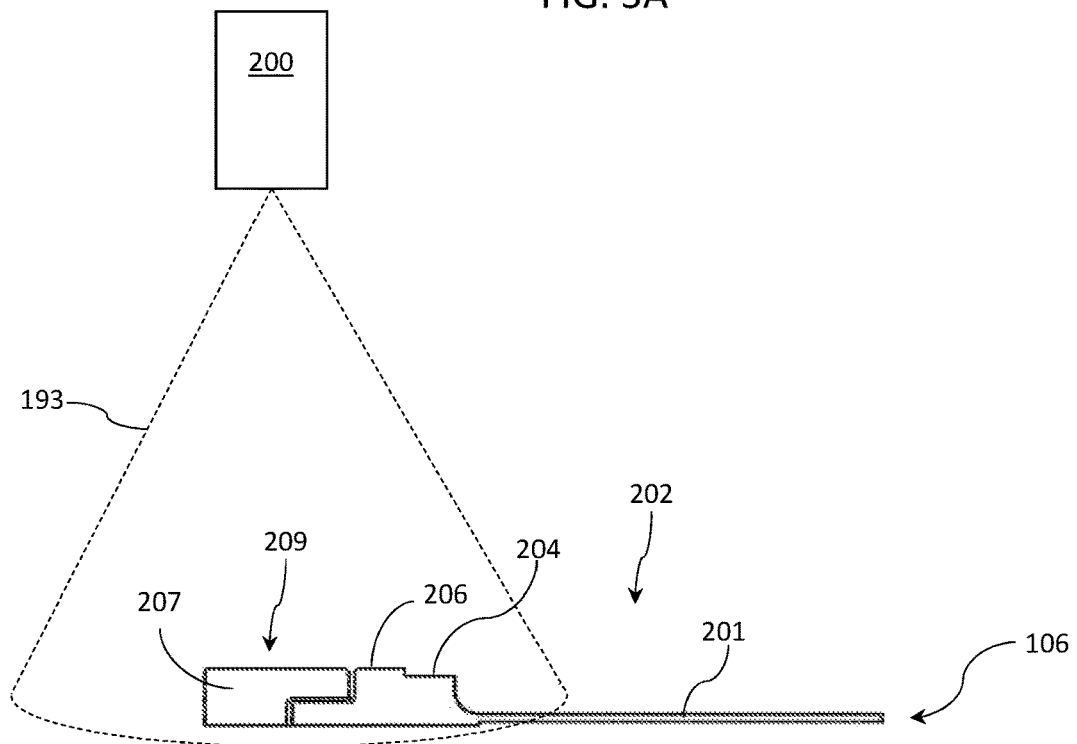
FIG. 3B shows the view field of a camera over a substrate support and a pre-heat ring in a process chamber, according to certain embodiments of the present disclosure.

In another embodiment, which can be combined with other embodiments described herein, the substrate support 106 may be coupled to a pre-heat ring 207 in a process chamber with the pre-heat ring 207 disposed around the periphery of the substrate support 106 when the substrate support 106 is in a processing position. The camera 200 may be used to image portions of the substrate support 106 and/or the pre-heat ring 207 coupled to the substrate support 106 within a view field 193 of the camera 200 (as shown in FIG. 3B) to identify and analyze the substrate support 106 and/or the pre-heat ring 207 coupled thereto. For in situ imaging and analysis of the substrate support 106 and/or the pre-heat ring 207 in the process chamber, the regions of interest of the substrate support and the pre-heat ring 207 in which the marking feature may be disposed on include a top surface 209 of the pre-heat ring 207 and portions of the substrate support 106 where the top surface 202 of the substrate support 106 remain unoccupied when the substrate support 106 is loaded with the substrate 108, as well as being within the field of view of the camera 200.

Figure 3C:
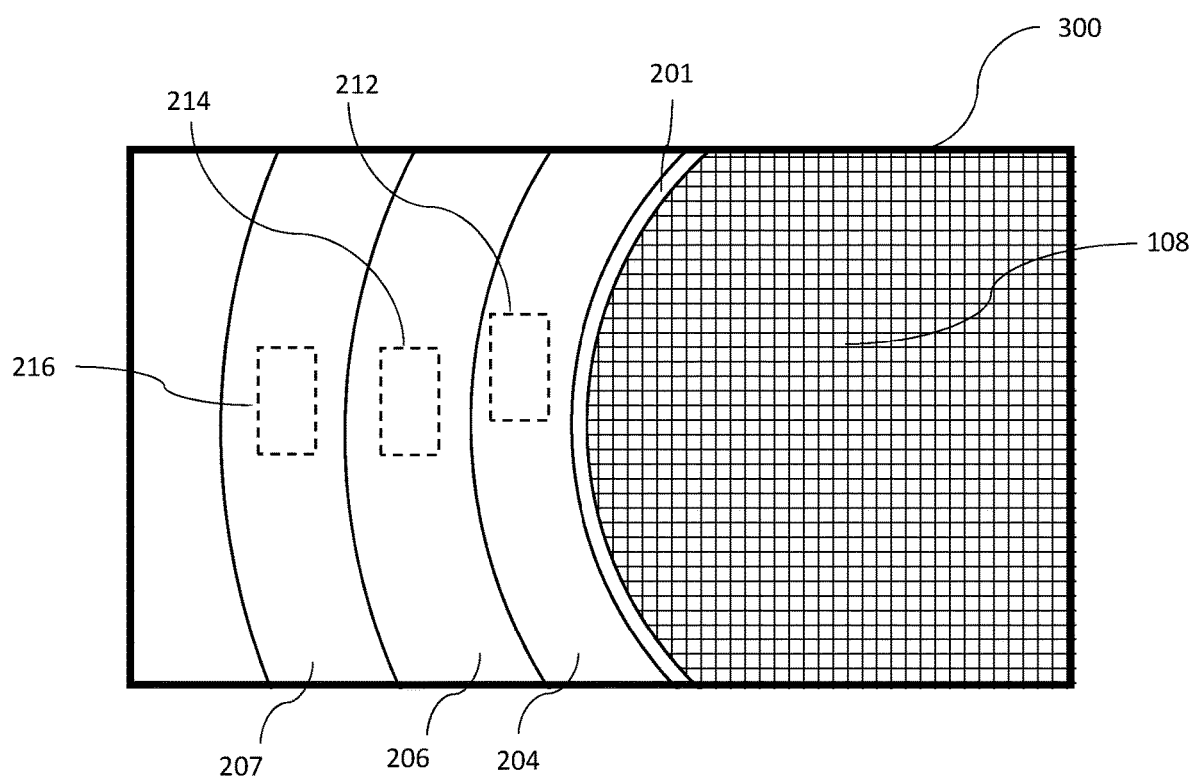
FIG. 3C is an example field of view of a camera showing regions of interest on the substrate support and pre-heat ring in FIG. 3B capable of being imaged, according to certain embodiment of the present disclosure.

FIG. 3C is an example image 300 from camera 200 positioned to capture images of the pre-heat ring 207, the substrate support 106, and the substrate 108 disposed in a process chamber. The image 300 includes regions of interest identified in which the marking feature may be disposed on, according to certain aspects of the present disclosure. As shown in FIG. 3C, the marking feature may be disposed in a first region of interest 212 on the edge 204 of the substrate support 106, a second region of interest 214 on the rim 206 of the substrate support 106, and/or a third region of interest 216 on the pre-heat ring 207. Since the substrate 108 would be loaded in the pocket 201 when the substrate support 106 is in use in the process chamber, marking features disposed on the pocket 201 would likely be covered by the substrate 108 and therefore not visible to the camera 200. Moreover, depending on how the marking feature is formed, the marking feature may affect the processing of the substrate 108 if disposed in the pocket 201. As such, regions of interest identified on the substrate support 106 include only the surface of the substrate support 106 on the edge 204 and rim 206 which are open when the substrate support 106 is in use. And, as shown in FIG. 3C, marking features disposed in the first and/or second regions of interest 212, 214 of the substrate support 106, as well as the third region of interest 216 on the pre-heat ring 207, are all capable of being imaged by the camera 200 when the substrate support 106 and pre-heat ring 207 are disposed within in the process chamber.

In some embodiments, depending on the shape, size, and positioning of the marking feature on the substrate support 106 and/or the pre-heat ring 207, different numbers of regions may be imaged at different locations. In some embodiments, the shape of the imaged regions may vary. For example, an imaged region may be rectangular, circular, or other shape.

Figure 4A:
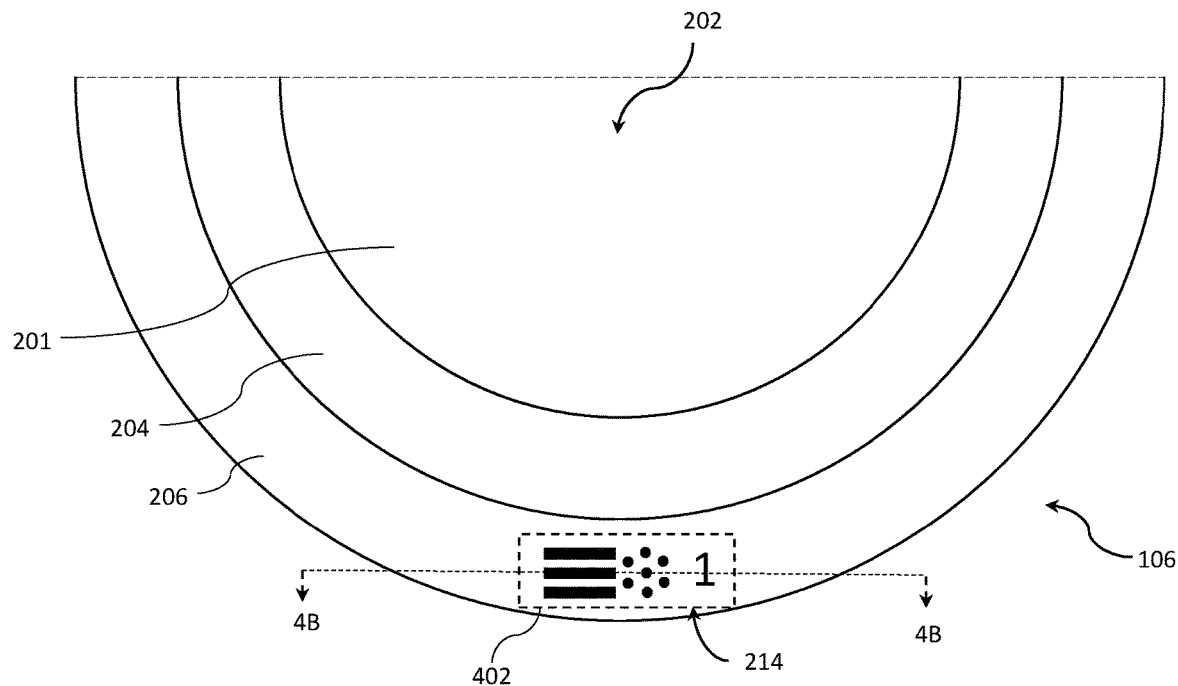
FIG. 4A shows a top view of a substrate support with a marking feature, according to certain embodiment of the present disclosure.

FIG. 4A shows a top view of an embodiment of the substrate support 106 having an example of a marking feature 402 disposed in the second region of interest 214 on the rim 206 of the substrate support 106, according to certain embodiments herein. Although some examples are described herein as applying the marking feature 402 to the substrate support 106, aspects and embodiments of the present disclosure described herein with respect to the marking feature 402 and the substrate support 106 may be similarly applicable to applying the marking feature 402 to the pre-heat ring 207 (if present in the process chamber).

When the substrate support 106 is disposed in the process chamber 100, the substrate support 106 may be rotated about the central shaft 132 such that snap shots of the marking feature 402 on the substrate support 106 may be obtained by the camera 200 when the marking feature 402 is rotated within the view field 193 of the camera 200. In an embodiment, which may be combined with other embodiments herein, the marking feature 402 may be of any type of designation capable of being disposed or formed on the top surface 202 of the substrate support 106 and detected by the camera 200 for analysis. In an embodiment, which may be combined with other embodiments discussed herein, the marking feature 402 may be a surface feature formed on the substrate support 106. In another embodiment, the marking feature 402 may be a surface feature etched into the surface of the substrate support 106. In certain embodiments, the designations for the marking feature 402 may include any number, letter, symbol, shape or pattern, including without limitation, a barcode, a numeric code, an alphanumeric code, a QR code, custom shapes, pattern of shapes, pattern of symbols, series of characters, special characters, and the like.

As mentioned above, each marking feature 402 to be disposed on the substrate support 106 and the pre-heat ring 207 may correspond with a specific model (or design) of a plurality of different substrate supports and pre-heat rings. Data associated with each of the marking features 402 used to identify each of the plurality of corresponding substrate support models may be stored in the memory 194 for search and retrieval by the controller 190. After the specific marking feature 402 on the substrate support 106 is imaged, the marking feature 402 is analyzed and may be used to identify the model of the corresponding substrate support or pre-heat ring the imaged marking feature 402 is disposed on.

Figure 4B:
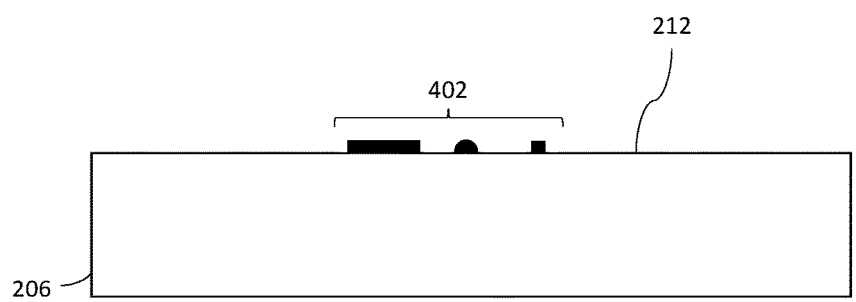
FIG. 4B shows a cross-sectional view of the substrate support of FIG. 4A along section line 4B-4B.

FIG. 4B shows a cross-sectional view of the substrate support 106 of FIG. 4A along section line 4B-4B. In certain embodiments, the marking feature 402 may extend from the top surface 202 of the substrate support 106 and be disposed on the first region of interest 212 and/or the second region of interest 214. The marking feature 402 may be sized and formed with a thickness sufficient for the marking feature 402 to be detected and imaged by the camera 200 from the surrounding top surface of the substrate support 106. Alternatively, the marking feature 402 may be disposed on the substrate support 106 and formed with a surface roughness different from the surface roughness of the top surface 202 of the substrate support 106 such that the camera 200 is able to distinguish and detect the marking feature 402 for analysis.

The marking feature 402 may be formed from a material compatible with the processing environment, such as such as silicon carbide (SiC), or graphite coated with SiC. The marking features 402 may be formed on the substrate support 106 in any suitable fashion, such as being cast in the substrate support 106, embossed into the substrate support 106, machined into the substrate support 106, deposited on the substrate support 106, or by roughening or treating the top surface 202 of the substrate support 106. For example, the features 402 may be conformally deposited on the top surface 202 of the substrate support 106 using a mask by a physical vapor deposition (PVD) process or other similar conformal deposition process. The conformal deposition of the marking features 402 enables the marking features 402 to retain a surface roughness similar to the surface roughness of remaining portions of the top surface 202. By matching the surface roughness of the rest of the top surface 202 and the surface roughness of the marking features 402, as described further below, the marking features 402 may be utilized to monitor the use of the substrate support 106 and act as an indicator of when the substrate support 106 likely to be near the end of its service life.

The imaging and analysis of the marking feature 402 on the substrate support 106 by the camera 200 in the process chamber 100 may be utilized to identify the specific design and model of the substrate support 106 loaded in the process chamber 100 without the need for removing the substrate support 106 from the process chamber 100.

Since substrate supports and pre-heat rings for process chambers can vary by design in a number of ways that may each require specific and different installation position, fabrication recipe, and/or substrate handling protocol, the ability to automatically identify the model and design of the substrate support and/or the pre-heat ring loaded in the process chamber without the need for manual enables an increase in efficiency and optimization in the set up and use of the substrate support 106 and pre-heat ring 207 (if present), as well as corresponding set up and optimizing of relevant parameters of the process chamber the imaged substrate support and/or the pre-heat ring is disposed in. Identifying and confirming the specific corresponding model and design of the substrate support 106 and pre-heat ring 207 installed in the process chamber 100 that is about to be used enables the user to check and confirm the proper substrate support 106 handling protocol and the corresponding optimal setup for the process chamber 100, based on the installed substrate support 106 and pre-heat ring 207 hardware that is to be used.

For example, corresponding fabrication recipes for substrate supports with different surface features and/or designs may be subject to different pressure and/or temperature ramping rates during processing. identifying and confirming the specific corresponding model and design of the substrate support 106 enables the user to check and confirm the fabrication recipe to be employed is proper and that the pressure and/or temperature ramping rate is appropriately limited. In another example, different substrate support designs may include different pocket sizes for receiving and holding the substrate 108. identifying and confirming the specific corresponding model and design of the substrate support 106 enables the user to check and confirm the substrate handling correction that may be required to keep the substrate handling in the pocket of the substrate support 106 used.

In another aspect, identifying and confirming the specific corresponding model and design of the substrate support 106 and/or the pre-heat ring 207 (if present) installed in the process chamber 100 may advantageously assist in tracing and confirming the installed position of the substrate support 106 and/or the pre-heat ring 207 in the process chamber 100 is correct and proper. Substrate supports are typically mounted and balanced on a plurality pin in the process chamber 100 and can be installed at multiple different angles. Conventionally, installation of substrate supports traditionally requires the user to manually track and install the substrate support with certain defined portions of substrate support installed at a certain position relative to a defined portion of the processing chamber. For example, instructions for installing conventional substrate supports may include installing the substrate support by manually positioning a logo or insignia on the substrate support closer to a certain portion of the process chamber 100, such as near the process gas inlet 174 or the gas outlet 178.

However, by disposing the marking feature 402 on the top surface 202 of the substrate support 106 in a position viewable by the camera 200 and identifying the specific model and design of the imaged substrate support 106 using the marking feature 402, the known position of the marking feature 402 on the substrate support 106 (due to the identification of the substrate support 106) and the imaged position of the marking feature 402 relative to installed position of the substrate support 106 in the process chamber 100, may be advantageously used to trace, confirm, and correspondingly correct (if needed) the installation position of the substrate support 106 to ensure the installed position of the substrate support 106 to be used is proper and optimal based on the specific substrate support 106 imaged and identified.

In another aspect, as mentioned above, the substrate support 106 disposed in the process chamber 100 may be moved vertically during processing by an actuator thereby causing the imaged size of the substrate support 106 to also change accordingly based on the changed distance between the substrate support 106 and the camera 200 (assuming settings such as a "zoom" by the camera 200 are kept constant). In certain embodiments, which can be combined with other embodiments described herein, the marking feature 402 disposed on the substrate support 106 may be used to provide a visible reference measurement point for use in providing direct scaling at the substrate support level when the substrate support 106 is imaged.

Figure 5:
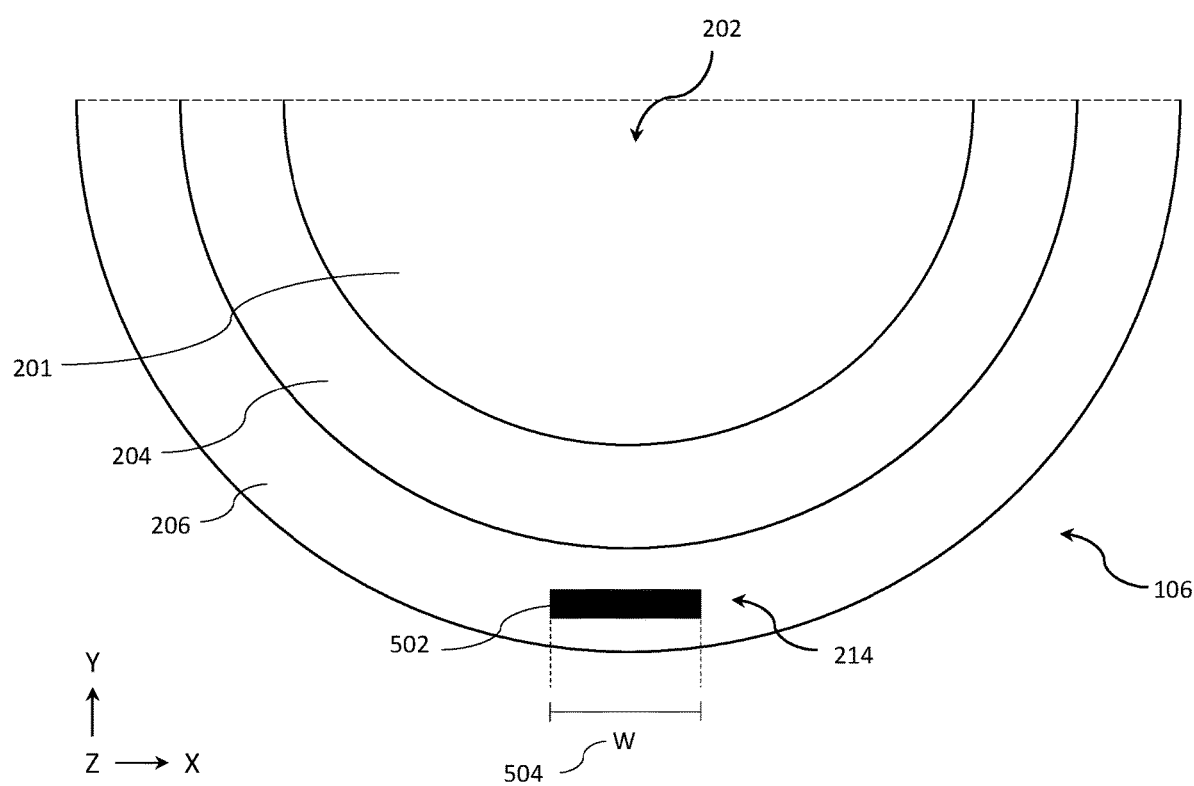
FIG. 5 shows a top view of a substrate support with a marking feature, according to certain embodiment of the present disclosure.

FIG. 5 shows a top view of a portion of an embodiment of the substrate support 106 formed with a marking feature 502 disposed on the rim 206 of the substrate support 106 in the second region of interest 214, according to certain embodiments herein. Although some examples are described herein as applying the marking feature 502 to the substrate support 106, aspects and embodiments of the present disclosure described herein with respect to the marking feature 502 and the substrate support 106 may be similarly applicable to applying the marking feature 502 to the pre-heat ring 207 (if present in the process chamber).

In an embodiment, which may be combined with other embodiments herein, the marking feature 502 disposed on the top surface 202 of the substrate support 106 may include one or more shapes or symbols formed with a dimension 504 having a predetermined size to enable the marking feature 502 to be used as a measurement scale. The portion of the marking feature 502 forming the dimension 504 must also extend along an X-Y plane parallel to the top surface 202 of the substrate support 106 to enable the dimension 504 of the image of the marking feature 502 to be imaged by the camera 200 and used as a scale for the respective image. For example, in an embodiment, the marking feature 502 may be formed as a rectangle in which the dimension 504 corresponds with a width "W." When the substrate support 106 containing the marking feature 502 is imaged by the camera 200, the imaged size of the mark feature 502 and the corresponding known size W of the dimension 504 may be used as a scale to calculate a correlation between the size of components in the captured image (in pixels) and the actual size of the component e.g. substrate support 106 and/or substrate 108 disposed on the substrate support 106) being imaged. The imaging and use of the marking feature 502 on the substrate support 106 to provide a measurement scale may advantageously be used to assist in correcting imaging distortions in the respective image and to perform measurements of imaged components during image analysis.

In another aspect, the marking feature 502 may be used to automatically detect via imaging analysis rotation angles of the substrate support 106 based on a known home zero angle position of the substrate support 106. Due to the identification of the substrate support 106, the relative positioning of the marking feature 402 on the substrate support 106 when the substrate support 106 is in the home zero angle position can be obtained and used as a reference point. By disposing the marking feature 402 on the top surface 202 of the substrate support 106 in a position viewable by the camera 200 and comparing the imaged position of the marking feature 402 on the substrate support 106 to the known position of the marking feature 402 when the substrate support 106 is in the home zero angle position, imaging of the substrate support 106 may be advantageously used to detect and determine rotation angles when the substrate support 106 is imaged for use and to assist in further imaging measurements and analysis operations.

In yet another aspect, the marking feature 502 may be advantageously used to also track the positioning of the substrate support 106 relative to the position of the substrate 108 correspondingly loaded on the substrate support 106 or to the process chamber 100. By imaging the position of the marking feature 502 relative to the loaded substrate support 106 prior to processing, the relative position and any corresponding changes or movements of the substrate 108 can be automatically tracked through imaging. Such tracking of the substrate support 106 relative to the substrate 108 enables the user to more easily narrow and identify the source of issues that may occur during processing. For example, when issues occur during processing, without the ability to track changes in the relative positioning of the substrate 108 on the substrate support 106 when the issue occurs, it may be difficult to ascertain whether the processing issue was caused by the process itself or associated with the substrate support 106. Moreover, by providing a reference point on the relative positioning of the substrate 108 to the substrate support 106 prior to processing, imaging may then be used to determine the angle of the substrate support 106 that may have contributed to the processing issue.

As discussed above, the repeated use of the substrate support 106 in process chamber 100 over time may cause the SiC in the substrate support 106 to degrade. Specifically, changes in the SiC surface emissivity of the substrate support 106 were observed during the service life of the substrate support 106. In certain processes, it was found that the SiC on the top surface 202 of the substrate support 106 is etched during processing thereby causing changes in the surface roughness and surface emissivity of the SiC on the surface of the substrate support 106. The etching and degrading of the SiC in the substrate support 106 may eventually affect the performance of the substrate support 106 and cause the substrate support 106 to fail. As such, a service life for the substrate support 106 may therefore be defined by the point in which the reliability and performance of the substrate support 106 becomes affected by the degradation and changes in the surface emissivity of the SiC on the outer surface of the substrate support 106.

Figure 6A:
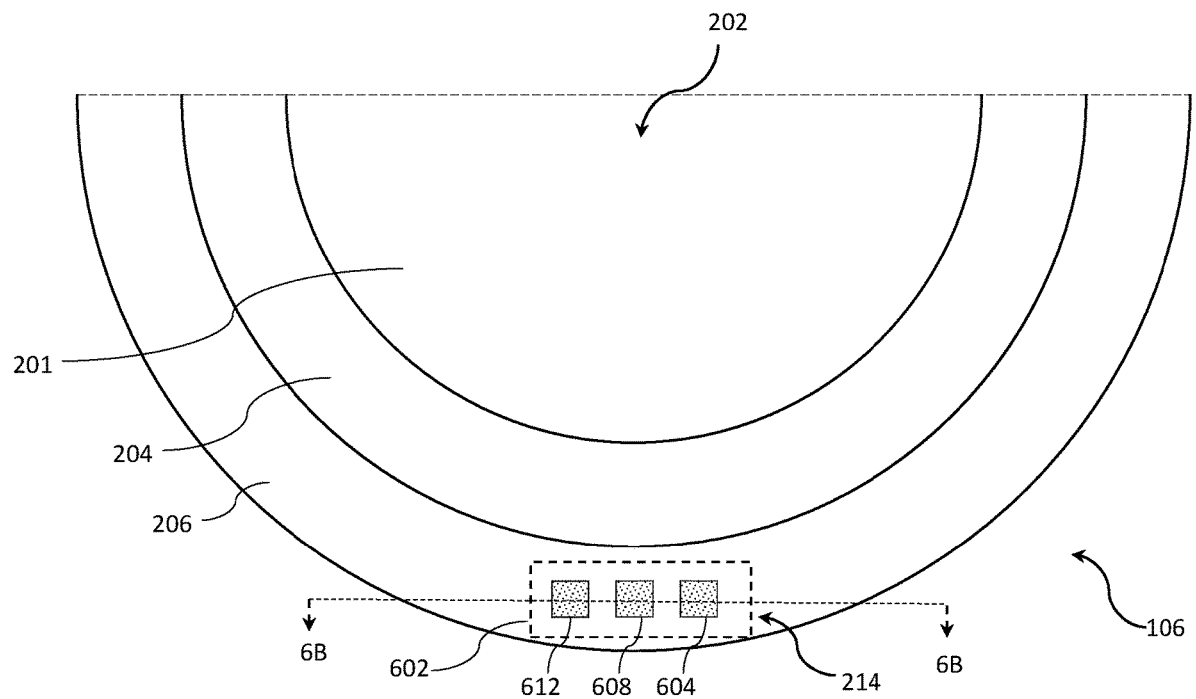
FIG. 6A shows a top view of a substrate support with a marking feature, according to certain embodiment of the present disclosure.

FIG. 6A shows a top view of a portion of an embodiment of the substrate support 106 formed with an example of a marking feature 602 disposed in the second region of interest 214 on the rim 206 of the substrate support 106, according to certain embodiments of the present disclosure. Although some examples are described herein as applying the marking feature 602 to the substrate support 106, aspects and embodiments of the present disclosure described herein with respect to the marking feature 602 and the substrate support 106 may be similarly applicable to applying the marking feature 602 to the pre-heat ring 207 (if present in the process chamber) to track a service life of the pre-heat ring 207 via imaging.

Figure 6B:
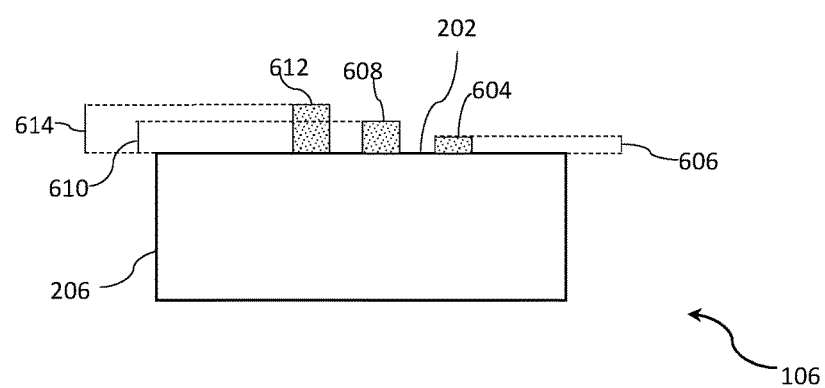
FIG. 6B shows a cross-sectional view of the substrate support of FIG. 6A along section line 6B-6B.

To track the service life of the substrate support 106 using imaging, the marking feature 602 formed on the substrate support 1106 may be used to provide users with estimates of the remaining service life of the substrate support 106 the marking feature 602 is disposed on. The marking feature 602 may be disposed on the top surface 202 of the substrate support 106 in any one of the regions of interest 212, 214 discussed herein. The marking feature 602 may be formed as a plurality of raised structural features each having varying heights extending from the top surface 202. The marking features 602 may be formed in any shape or size detectable by the camera 200. In the example shown in FIGS. 6A and 6B, the marking feature 602 is formed as three square prisms extending from the top surface 202 of the substrate support 106. In alternative embodiments, the marking feature 602 may be formed with any number of features.

In an embodiment, which may be combined with other embodiments described herein, the marking feature 602 may include a first feature 604 with a first height 606, a second feature 608 with a second height 610, the second height 610 being greater than the first height 606, and a third feature 612 with a third height 614, the third height 614 being greater than the second height 610. In an embodiment, which may be combined with other embodiments described herein, the marking feature 602 may be formed as reverse dimples.

Each of the first, second, and third features 604, 608, 612 of the marking feature 602 may be formed similar to that of the substrate support 106 such that the original surface roughness and emissivity of the marking feature 602 is substantially the same as the original surface roughness and emissivity of the top surface 202. In certain embodiments, the marking feature 602 may be formed by depositing SiC on the top surface 202 via a deposition process, depositing a graphite core on the top surface 202 and coating the graphite core with SiC, or etching the top surface 202 in the substrate support 106 to form a graphite core and coating the graphite core with SiC. Forming the marking feature 602 to be the same or similar to the substrate support 106 enables the marking feature 602 to be etched in the same or similar manner as the substrate support 106 during processing. Such etching and changes in the surface roughness of the SiC coating on the substrate support 106 may be imaged by the camera 200 and analyzed to monitor the service life of the substrate support 106 and provide a corresponding indicator of when the substrate support 106 is likely to be near the end of its service life.

The service life of the substrate support 106 may be monitored by analyzing and tracking changes in the images of the marking feature 602 obtained over time as the substrate support 106 is used. As the marking feature 602 is etched by each cycle of processing of the substrate support 106, the height of each of the first, second, and third features 604, 608, 612 is gradually lost with the features 604, 608, 612 becoming more planarized with the top surface 202 of the substrate support 106. As the height of the marking feature 602 is lost over time, the images of each of the features 604, 608, 612 in the marking feature 602 obtained by the camera 200 will correspondingly change. Detection of such changes in the images of each of the respective features 604, 608, 612 by the camera 200 may then operate as respective indicators of the extent of use and hence extent of SiC degradation experienced by the respective substrate support 106 thus far. Knowing the extent of SiC etching and degradation can in turn be translated to an estimated remaining service life for the imaged substrate support 106. The marking feature 602 may be formed with any number of features. The marking feature 602 may be formed with just one feature to provide a single indicator of when the substrate support 106 is near the end of its service life. The number of and height of each of the features in the marking feature 602 may therefore be adjusted and tailored accordingly to provide more or less indicators of the remaining service life of the substrate support 106.

In an embodiment, which may be combined with other embodiments herein, the varying heights of the first, second, and third features 604, 608, 612 of the marking feature 602 may therefore be formed to correlate with the amount of total SiC etching typically experienced at various stages throughout the service life of the substrate support 106. In an embodiment, the first, second, and third features 604, 608, 612 may be formed as indicators of the substrate support 106 having gone through about a third of its service life, respectively. The marking features 602 may be formed such that imaging of the first, second, and third features 604, 608, 612 will initially all be visible and clear when the substrate support 106 is new. As the substrate support 106 is used, all of the features 604, 608, 612 will be etched simultaneously along with the rest of the substrate support 106. The first height 606 of the first feature 604 may be sized to be sufficiently etched only after about a third of the typical service life of the substrate support 106 has occurred, and thereby correspondingly causing changes in its imaging to be detected by the camera 200. Changes in images of the first feature 604 include images of the first feature 604 becoming blurred and/or no longer being visible to the camera 200. When compared to the first feature 604, the greater second and third heights 610, 614 enables the second and third features 608, 612 to be susceptible to more etching and the imaging of the second and third features 608, 612 will therefore remain unchanged.

The third feature 612 may in turn be formed with the third height 614 corresponding to a height of a total amount of SiC etching typically experienced by the top surface 202 of the substrate support 106 prior to failure. The third height 614 may be formed such that images of the third feature 612 obtained will also change, become blurred, and/or no longer be visible to the camera 200 after an amount of processing and etching of the substrate support 106 corresponding to about the typical service life of the substrate support has occurred. When such change in the imaging of the third feature 612 is imaged and detected by the camera 200, an indicator that the imaged substrate support 106 has reached near the end of its service life and should therefore be changed may be provided to the user. The imaging and analysis to check the marking features 602 for indicators of the remaining service life of the substrate support 106 may be automatically employed prior to each use of the substrate support 106 to minimize the chances of a failure of the substrate support 106 during use.

In another embodiment, the third feature 612 may be formed with a third height 614 that corresponds to just a little less than a total amount of SiC etching typically experienced by a substrate support prior to failure. Forming the third height 614 to be just a little less than a typical total etch amount prior to failure allows the third feature 612 to operate as an early warning indicator that the imaged substrate support 106 is about to reach the end of its service life and should be changed. Having a slightly earlier warning indicator to change the substrate support 106 prior to failure may also minimize the chance of an actual failure of the substrate support 106 during use in processing (and possibly thereby ruining the components being fabricated) before the indicator from the third feature 612 is detected and the substrate support 106 changed.

The second height 610 of the second feature 608 may be formed to be about double the first height 606. When a change in the imaging of the second feature 608 is accordingly imaged and detected by the camera 200 after use, an indicator that about two thirds of the service life of the imaged substrate support 106 has been used (or approximately a third of the service life remains) may be provided to the user.

In summation, implementations of the above disclosure described herein provide an apparatus and method for identifying a substrate support and a pre-heat ring disposed in a process chamber via imaging and obtaining information related to the imaged substrate support and pre-heat ring in the process chamber thereof. Methods and apparatus for identifying the substrate support and the pre-heat ring generally include disposing a marking feature on a top surface of the substrate support and the pre-heat ring and imaging the marking features when the substrate support and pre-heat ring are disposed inside the process chamber to identify the specific model of the substrate support and pre-heat ring disposed in the process chamber. Each marking feature to be disposed on a substrate support corresponds with one specific model (or design) of a plurality of different substrate supports. Likewise, each marking feature to be disposed on a pre-heat ring corresponds with one specific model (or design) of a plurality of different pre-heat rings. When the specific marking feature on the substrate support is imaged, the marking feature is analyzed and may then be used to identify the model of the respective substrate support or pre-heat ring the imaged marking feature is disposed on. Marking features may also be disposed on the substrate support and/or the pre-heat ring to provide information related to the substrate support, the pre-heat ring, and/or the imaging of the substrate support and the pre-heat ring. Information that may be provided via imaging of marking features on the substrate support and pre-heat ring include without limitation information related to a reference measurement for direct scaling at the substrate support/pre-heat ring level for use with imaging of the substrate support and pre-heat ring in the process chamber, a reference point for detection and determination of rotation angles by the substrate support in the process chamber, a reference point for detection and tracing of the installation position of the substrate support and the pre-heat ring in the process chamber, and/or an indication of when the substrate support and/or the pre-heat ring is likely to be near the end of its service life.

Embodiments of the disclosure have been described above with reference to specific embodiments and numerous specific details are set forth to provide a more thorough understanding of the invention. Persons skilled in the art, however, will understand that various modifications and changes may be made thereto without departing from the broader spirit and scope of the invention. The foregoing description and drawings are, accordingly, to be regarded in an illustrative rather than a restrictive sense.

While the foregoing is directed to embodiments of the present invention, other and further embodiments of the invention may be devised without departing from the basic scope thereof, and the scope thereof is determined by the claims that follow.

What is claimed is:

1. A substrate support, comprising:
    a top surface configured to receive a substrate in a process chamber, the top surface of the substrate support comprising a rim bordering a pocket, the pocket configured to receive the substrate; and
    a marking feature disposed on the rim of the substrate support, the marking feature configured to be detectable by an imaging apparatus coupled to the process chamber to provide information related to the substrate support via imaging when the substrate support is disposed within the process chamber.

2. The substrate support of claim 1, wherein the marking feature disposed on the substrate support corresponds to one of a plurality of models of substrate supports for identification of the model of the substrate support via imaging.

3. The substrate support of claim 1, wherein the marking feature comprises a known dimension extending along the top surface of the substrate support, the known dimension providing direct scaling to the substrate support for imaging of the substrate support when the marking feature is imaged.

4. The substrate support of claim 1, wherein the marking feature is configured to provide a reference point for determination of a rotation angle of the substrate support via imaging.

5. The substrate support of claim 1, wherein the marking feature comprises a designation, shape, or pattern, including without limitation, a barcode, a numeric code, an alphanumeric code, a QR code, custom shapes, a pattern of shapes, symbols, and special characters.

6. The substrate support of claim 1, wherein the marking feature is configured to provide a reference point for tracking an installation position of the substrate support in the process chamber via imaging.

7. A substrate support, comprising:
a top surface configured to receive a substrate in a process chamber, the top surface of the substrate support comprising a rim bordering a pocket, the pocket configured to receive the substrate; and
a marking feature disposed on the rim of the substrate support, the marking feature comprising a height extending from the rim of the substrate support and an outer surface containing silicon carbide (SiC), and wherein the marking feature is configured to be detectable by an imaging apparatus coupled to the process chamber when the substrate support is disposed within the process chamber.

8. The substrate support of claim 7, wherein the marking feature is disposed on the substrate support by depositing SiC on the rim of the substrate support.

9. The substrate support of claim 7, wherein the marking feature is disposed on the substrate support by etching a graphite core on the rim of the substrate support and coating or polishing an outer surface of the graphite core with SiC.

10. The substrate support of claim 7, wherein a degradation level of the marking feature is configured to provide an indication of a remaining service life of the substrate support via imaging.

11. The substrate support of claim 7, wherein changes in the height of the marking feature provides an indication of a remaining service life of the substrate support when the change in the marking feature is detected by the imaging apparatus.

12. A processing system configured to analyze a substrate support disposed in a process chamber, comprising:
a process chamber having a process volume;
an imaging apparatus coupled to the process chamber, the imaging apparatus having a view field;
a controller coupled to the imaging apparatus, the controller comprising a processor and a memory, wherein the memory includes a software program configured to perform an operation for imaging and obtaining information related to a substrate support disposed in the processing volume of the process chamber when the substrate support is in the view field of the imaging apparatus; and
wherein the substrate support comprises a top surface configured to receive a substrate in the process chamber, the top surface of the substrate support comprising a rim bordering a pocket, the pocket configured to receive the substrate; and
a marking feature disposed on the rim of the substrate support, the marking feature configured to be detectable by the imaging apparatus to provide information related to the substrate support via imaging when the substrate support is disposed within the process chamber.

13. The system of claim 12, wherein the marking feature disposed on the substrate support corresponds to one of a plurality of models of substrate supports for identification of the model of the substrate support via imaging.

14. The system of claim 12, wherein the marking feature comprises a known dimension extending along the top surface of the substrate support, the known dimension providing direct scaling to the substrate support for imaging of the substrate support when the marking feature is imaged.

15. The system of claim 12, wherein the marking feature is configured to provide a reference point for determination of a rotation angle of the substrate support via imaging.

16. The system of claim 12, wherein a degradation level of the marking feature is configured to provide an indication of a remaining service life of the substrate support via imaging.

17. The system of claim 12, wherein the marking feature is configured to provide a reference point for tracking an installation position of the substrate support.

18. The substrate support of claim 7, wherein the marking feature disposed on the substrate support corresponds to one of a plurality of models of substrate supports for identification of the model of the substrate support via imaging.

19. The processing system of claim 12, wherein the marking feature disposed on the substrate support corresponds to one of a plurality of models of substrate supports for identification of the model of the substrate support via imaging.

* * * * *